United States Patent
Wang et al.

(10) Patent No.: US 9,397,238 B2
(45) Date of Patent: Jul. 19, 2016

(54) METHOD OF ETCHING A SEMICONDUCTOR LAYER OF A PHOTOVOLTAIC DEVICE

(75) Inventors: Jianjun Wang, Perrysburg, OH (US); Oleh P. Karpenko, Perrysburg, OH (US); Thomas A. Sorenson, Toledo, OH (US)

(73) Assignee: FIRST SOLAR, INC., Perrysburg, OH (US)

( * ) Notice: Subject to any disclaimer, the term of this patent is extended or adjusted under 35 U.S.C. 154(b) by 432 days.

(21) Appl. No.: 13/609,284

(22) Filed: Sep. 11, 2012

(65) Prior Publication Data

US 2013/0068301 A1    Mar. 21, 2013

Related U.S. Application Data

(60) Provisional application No. 61/536,151, filed on Sep. 19, 2011.

(51) Int. Cl.

| | |
|---|---|
| *H01L 21/06* | (2006.01) |
| *H01L 31/0224* | (2006.01) |
| *H01L 31/0376* | (2006.01) |
| *H01L 31/0236* | (2006.01) |
| *H01L 31/0296* | (2006.01) |
| *H01L 31/20* | (2006.01) |

(52) U.S. Cl.
CPC .... *H01L 31/022425* (2013.01); *H01L 31/0296* (2013.01); *H01L 31/02363* (2013.01); *H01L 31/0376* (2013.01); *H01L 31/208* (2013.01); *Y02E 10/50* (2013.01); *Y02P 70/521* (2015.11)

(58) Field of Classification Search
CPC .................. H01L 31/022425; H01L 31/0376; H01L 31/0264; H01L 31/02363; H01L 31/0296; H01L 31/208

See application file for complete search history.

(56) References Cited

U.S. PATENT DOCUMENTS

| | | | |
|---|---|---|---|
| 4,456,630 A * | 6/1984 | Basol | H01L 21/443 136/256 |
| 6,184,456 B1 | 2/2001 | Matsuyama et al. | |
| 7,943,415 B1 * | 5/2011 | Gossman | C23C 14/0057 438/93 |
| 2007/0227578 A1 * | 10/2007 | Perozziello et al. | 136/244 |
| 2008/0308156 A1 | 12/2008 | Boyer | |
| 2009/0020157 A1 | 1/2009 | Krasnov et al. | |
| 2009/0194155 A1 | 8/2009 | Den Boer et al. | |
| 2009/0266399 A1 | 10/2009 | Basol et al. | |
| 2009/0269877 A1 | 10/2009 | Pinarbasi et al. | |
| 2010/0089444 A1 | 4/2010 | Thomsen et al. | |
| 2010/0126571 A1 | 5/2010 | Kizilyalli et al. | |

(Continued)

FOREIGN PATENT DOCUMENTS

WO    WO2008100603    8/2008

OTHER PUBLICATIONS

"The dynamics of Cadmium Telluride Etching" K. D. Dobson, P. D. Paulson, B. E. McCandless and R. W. Birkmire, Mat. Res. Soc. Symp. Proc. vol. 763, 2003, pp. B3.1.1-12.*

Romain Cayzac et al. "Optical absorbance enhancement by electrochemical surface roughening of CuInS2 thin films"; J. Mater. Res., vol. 24, No. 10, Oct 2009, pp. 3044-3049.*

(Continued)

*Primary Examiner* — Evan Pert
*Assistant Examiner* — Farid Khan
(74) *Attorney, Agent, or Firm* — Blank Rome LLP

(57) ABSTRACT

A method and apparatus provide for a roughened back surface of a semiconductor absorber layer of a photovoltaic device to improve adhesion. The roughened back surface may be achieved through an etching process.

20 Claims, 5 Drawing Sheets

(56) References Cited

U.S. PATENT DOCUMENTS

| | | | |
|---|---|---|---|
| 2010/0132780 A1 | 6/2010 | Kizilyalli et al. | |
| 2010/0187249 A1* | 7/2010 | Kernick | G07F 11/54 221/1 |
| 2011/0117696 A1* | 5/2011 | Fisher | C09K 13/00 438/102 |
| 2011/0143489 A1* | 6/2011 | Korevaar | 438/84 |
| 2011/0263070 A1* | 10/2011 | Schaeffer | H01L 21/6715 438/84 |
| 2011/0265868 A1* | 11/2011 | Drayton | H01L 31/0296 136/256 |
| 2011/0265874 A1* | 11/2011 | Gossman | C23C 14/0629 136/260 |
| 2012/0024380 A1* | 2/2012 | Feldman-Peabody | C23C 14/0057 136/260 |
| 2012/0192924 A1* | 8/2012 | Basol | 136/249 |

OTHER PUBLICATIONS

W. K. Batchelor et al., "Impact of Substrate Roughness on $CuIn_xGa_{1-x}Se_2$ Device Properties," Solar Energy Materials & Solar Cells, vol. 83, pp. 67-80, 2004.

R. Cayzac et al., "Optical Absorbance Enhancement by Electrochemical surface Roughening of $CuInS_2$ Thin Films," J. Mater. Res., vol. 24, No. 10, pp. 3044-3049, Oct. 2009.

S.J.C. Irvine et al., "In Situ Monitoring of the MOCVD Growth of CdS/CdTe," Journal of Crystal Growth, vol. 221, pp. 117-123, 2000.

Y. Onuma et al., "Preparation and Characterization of $CuInS_2$ Thin Films Solar Cells with Large Grain," Solar Energy Materials & Solar Cells, vol. 69, pp. 261-269, 2001.

J.D. Walker et al., "Dielectric Functions and Growth Dynamics of $CuIn_{1-x}, Ga_x Se_2$ Absorber Layers Via in Situ Real Time Spectroscopic Ellipsometry," IEEE 978-1-4244-2950-9/09, pp. 001154-001156, 2009.

* cited by examiner

METHOD OF ETCHING A SEMICONDUCTOR LAYER OF A PHOTOVOLTAIC DEVICE

CLAIM OF PRIORITY

This application claims priority under 35 U.S.C. §119(e) to U.S. Provisional Patent Application Ser. No. 61/536,151 filed on Sep. 19, 2011, which is hereby incorporated by reference in its entirety.

FIELD OF THE INVENTION

Embodiments of the invention relate to a photovoltaic (PV) device with a semiconductor absorber layer and a manufacturing method thereof.

BACKGROUND OF THE INVENTION

A PV device converts the energy of sunlight directly into electricity by the photovoltaic effect. The PV device can be, for example, a PV cell, such as a crystalline silicon cell or a thin-film cell. PV modules can include a plurality of PV cells or devices. PV cells can include multiple layers created on a substrate (or superstrate). For example, a PV device can include a transparent conductive oxide (TCO) layer, a buffer layer, and semiconductor layers formed in a stack on a substrate. The semiconductor layers can include a semiconductor window layer formed on the buffer layer and a semiconductor absorber layer formed on the semiconductor window layer. Additionally, each layer can cover all or a portion of the device and/or all or a portion of the layer or substrate underlying the layer. For example, a "layer" can include any amount of any material that contacts all or a portion of a surface.

FIG. 1 is a cross-sectional view of a conventional PV device 10 typically formed sequentially in a stack on a substrate 110, e.g., soda-lime glass. Because substrate 110 is not conductive, PV device 10 can include a front contact 120, which can include a multi-layered TCO stack with several functional layers including a barrier layer to protect the semiconductor layers from potential contaminants, a TCO layer, and a buffer layer to mitigate potential irregularities during the formation of the semiconductor layers, for example. The semiconductor layers can include an n-type semiconductor window layer 130, such as a cadmium sulfide (CdS) layer, formed on the front contact 120 and a p-type semiconductor absorber layer 140, such as a cadmium telluride (CdTe) layer, formed on the semiconductor window layer 130. The window layer 130 can allow the penetration of solar energy to the absorber layer 140, where the optical energy is converted into electrical energy. Specifically, the n-type window layer 130 may contact the p-type absorber layer 140 to form a p-n junction. As a result of diffusion across the junction, negative acceptor ions are formed on the p-type side and positive donor ions are formed on the n-type side. The presence of the ions creates a built-in electric field across the junction. When a photon is absorbed within the p-n junction, an electron-hole pair is formed. Movement of the electron-hole pairs are influenced by the built-in electric field, which produces current flow between the front contact 120 and a back contact 150. Back contact 150 is formed over absorber layer 140. Back contact 150 may be a low-resistance ohmic contact. Front and back contacts 120, 150 may serve as electrodes for transporting photocurrent away from PV device 10. Back support 160, which may be glass, is formed over back contact 150 to protect PV device 10 from external hazards.

During fabrication, absorber layer 140 can be formed (or deposited) on window layer 130 by a vapor transport deposition (VTD) distributor system, for example, and then heat treated. After deposition of absorber layer 140, a back surface 149 of absorber layer 140 may have a surface roughness quantified by the arithmetic mean value (Ra, a measurement of the average roughness of a surface calculated based on the height variations of the surface) that is smooth, e.g., less than about 10 nm, which could affect adhesion of the back contact 150 to the absorber layer 140. Additionally, a smooth back surface 149 of absorber layer 140 could potentially inhibit CdTe grain growth and doping uniformity during post-deposition heat treatment. CdTe grain growth can produce a larger CdTe grain size in the CdTe layer which may increase carrier (e.g., electron, hole) mobility within the p-n junction and thus may boost the electrical output of PV device 10.

A semiconductor absorber layer of a PV device having a greater back surface roughness is desirable.

DETAILED DESCRIPTION OF THE INVENTION

In the following detailed description, reference is made to the accompanying drawings, which form a part hereof, and in which is shown by way of illustration specific embodiments that may be practiced. It should be understood that like reference numbers represent like elements throughout the drawings. Embodiments are described in sufficient detail to enable those skilled in the art to make and use them, and it is to be understood that structural, material, electrical, and procedural changes may be made to the specific embodiments disclosed, only some of which are discussed in detail below.

The various embodiments disclosed herein entail etching a semiconductor absorber layer of a PV device. Etching the semiconductor absorber layer can increase the surface roughness of the back surface (i.e., non-sunny side) of the absorber layer, which can improve adhesion of a back contact to the back surface of an absorber layer for better long-term efficiency and reliability of the PV device. In addition, etching the absorber layer increases its porosity, which enhances doping uniformity and grain growth during heat treatment after the etching step.

Fabrication of semiconductor layers of a PV device may involve transport of vapor from a source to a substrate, or sublimation of a solid in a closed system, for example. An apparatus for manufacturing PV devices can include a conveyor, for example a roll conveyor for conveying a substrate through a deposition chamber. The conveyor transports the substrate, e.g. a soda-lime glass plate, into a series of deposition stations for sequentially depositing layers of material on the exposed surface of the substrate. The deposition chamber can be heated to reach a processing temperature in the range of about 450° C. to about 700° C. and includes a deposition distributor connected to a deposition vapor supply. The distributor can be connected to multiple vapor supplies for deposition of various layers or the substrate can be moved through multiple and various deposition stations, each with its own vapor distributor and supply. The distributor can be in the form of a spray nozzle with varying nozzle geometries to achieve uniform distribution of the vapor supply.

Figure 2A:
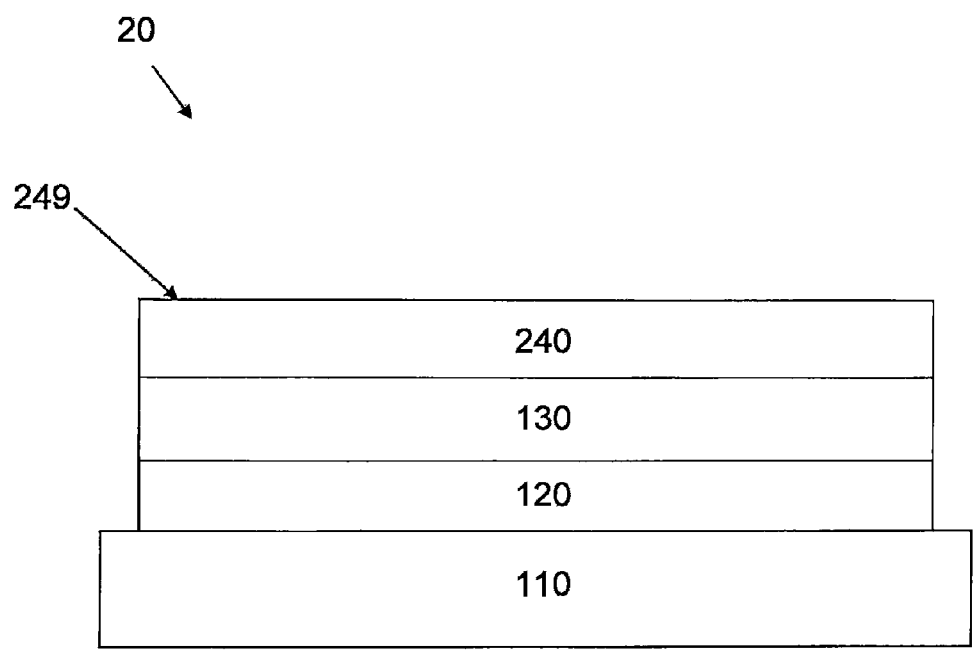
FIG. 2A is a cross-sectional view of a PV device according to an embodiment of the invention at an initial stage of processing.

FIG. 2A illustrates a cross-sectional view of a portion of a PV device 20 at an initial stage of processing, prior to the etching step. PV device 20 includes a substrate 110, e.g., soda-lime glass, a front contact 120, which can include a multi-layered TCO stack with several functional layers, such as a barrier layer, a TCO layer, and a buffer layer, for example. A semiconductor window layer 130 is formed over the front contact 120. Window layer 130 can be any suitable material, for example, a binary semiconductor such as Group II-VI or III-V semiconductors, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, or mixtures thereof.

Semiconductor absorber layer 240 may be formed adjacent to semiconductor window layer 130 using any suitable deposition technique. For instance, absorber layer 240 may be deposited using a VTD system, or more specifically, atmospheric pressure chemical vapor deposition (APCVD), sputtering, atomic layer epitaxy (ALE), laser ablation, physical vapor deposition (PVD), close-spaced sublimation (CSS), electrodeposition (ED), screen printing (SP), spray, or metal organic chemical vapor deposition (MOCVD). Absorber layer 240 can be any suitable semiconductor material, for example, CIGS, CdTe, or amorphous Si.

In one embodiment, window layer 130 and absorber layer 240 are CdS and CdTe, respectively.

The surface roughness of the back surface 249 of absorber layer 240 can be quantified by the arithmetic mean value (Ra) and the root mean-square-average (Rq). Surface roughness Ra can be measured by optical reflectometry using a surface sensor that provides a flash of light and measures the reflected and scattered light, which determines surface roughness. Prior to the processing steps described below in connection with FIG. 2B, the back surface 249 of absorber layer 240 can have a first surface roughness mean value (first Ra) of less than 10 nm, which is relatively smooth. This could undermine adhesion of back contact 150 to absorber layer 240, which protects against delamination, and may result in decreased porosity of absorber layer 240, which could inhibit doping uniformity and grain growth during heat treatment after the deposition of absorber layer 240.

Figure 2B:
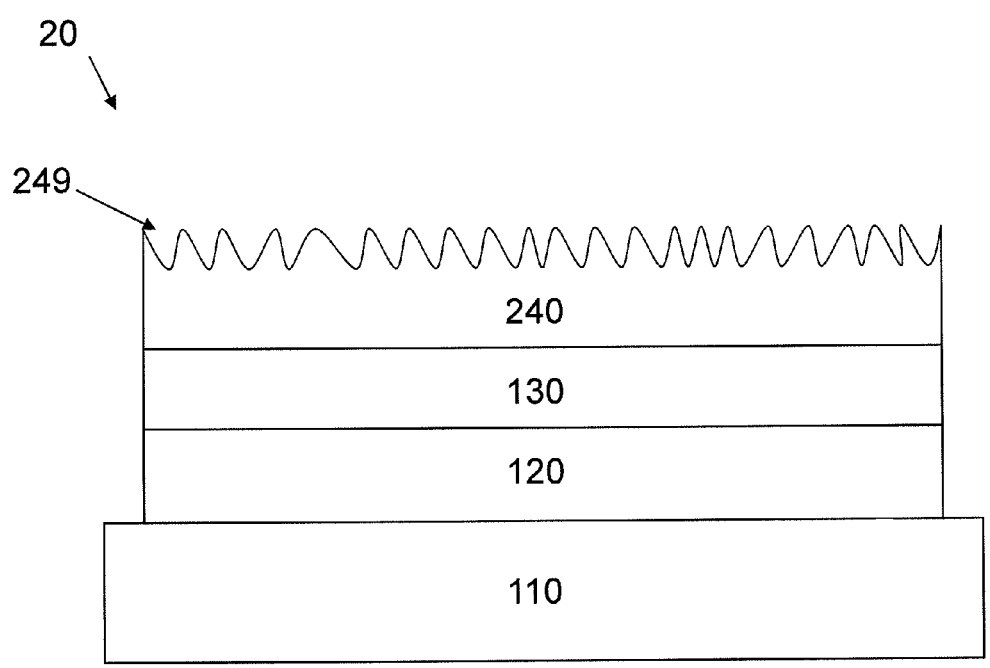
FIG. 2B is a cross-sectional view of the PV device of FIG. 2A at a stage of processing subsequent to that of FIG. 2A.

To mitigate such potential hazards, and now referring to FIG. 2B, the back surface 249 of the absorber layer 240 is etched to increase surface roughness. Accordingly, after formation of the absorber layer 240 as described with respect to FIG. 2A, at least a portion of the back surface 249 (i.e., non-sunny side) of the absorber layer 240 is contacted with an etchant. FIG. 2B illustrates a cross-sectional view of a portion of PV device 20 following the etching step.

The back surface 249 of the absorber layer 240 can be etched by any suitable known etching technique, such as wet or dry chemical etching or mechanical scrubbing. The etching may also include spraying at least a portion of back surface 249 of absorber layer 240 with an etchant or immersing at least a portion of absorber layer 240 in the etchant. The etchant can be a liquid or a powder, for example.

According to one embodiment, the etchant includes an acid, such as hydrochloric acid (HCl), an oxidizer, such as hydrogen peroxide ($H_2O_2$), and water. The etchant may include about 1% to about 10% HCl, about 0% to about 10% $H_2O_2$, and at least about 80% water, by volume, where HCl is about a 37% solution and $H_2O_2$ is about a 32% solution, by volume. In another embodiment, the etchant may include about 1.5% HCl and about 0.75% $H_2O_2$, by volume. Back surface 249 of absorber layer 240 can be etched for a period of about 10 seconds to about 50 seconds or for another period of time suitable to increase the Ra of the back surface 249 of absorber layer 240. Generally, the etching time will be shorter with higher concentrations of the acid and the oxidizer. The etching may occur at room temperature. Absorber layer 240 is rinsed in deionized water and air dried after etching. The etching step may be repeated one or more times. In one embodiment, the etching step is repeated if the surface roughness mean value (Ra) of the back surface 249 of absorber layer 240 is less than about 10 nm.

The etching step modifies at least a portion of back surface 249 of absorber layer 240 such that back surface 249 has a second surface roughness mean value (second Ra) that is greater than the first Ra after the initial formation of absorber layer 240 (FIG. 2A). Accordingly, the second Ra is greater than about 10 nm. The increased Ra of back surface 249 can improve the efficiency of PV device 20 by improving the adhesion between absorber layer 240 and a back contact, which may be formed adjacent to (or over) and in contact with absorber layer 240 later in the manufacturing process, described with respect to FIG. 4.

Figure 3:
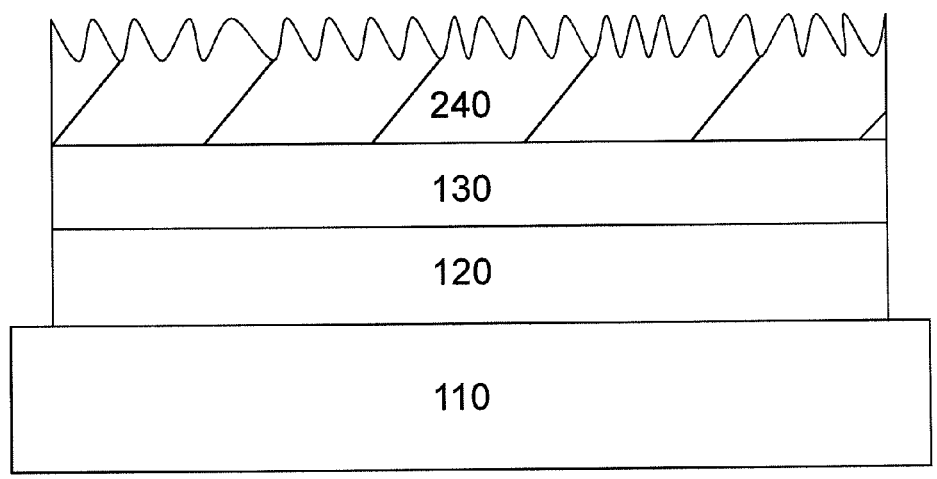
FIG. 3 is a cross-sectional view of the PV device of FIG. 2B at a stage of processing subsequent to that of FIG. 2B.

Referring to FIG. 3, after the etching step, the absorber layer 240 can be heat treated with a chloride compound, e.g., $CdCl_2$ flux. FIG. 3 illustrates a cross-sectional view of PV device 20 following heat treatment. The chloride compound may be applied by various techniques, such as by solution spray, vapors, or atomized mist. Post-etching chloride heat treatment can repair any defects in the absorber layer 240 caused by the etching step and can enlarge CdTe grains. For example, chloride heat treatment can heal shunts or shunting paths caused by etching. During heat treatment, recrystallization can occur, thereby making a more uniform doping (e.g. $CdCl_2$) distribution within the absorber layer 240 possible. In one embodiment, absorber layer 240 is heat treated with $CdCl_2$ for about 20 minutes. In one embodiment, heat treatment is conducted at a temperature in the range of about 380° C. to about 450° C.

Generally, the efficiency of the PV device 20 is determined by measuring open-circuit voltage, short-circuit current, and fill factor. Open-circuit voltage (Voc) is the voltage for which the current in the external circuit is zero. Short-circuit current (Jsc) is the current that flows out of the solar cell at zero bias. The fill factor (FF) is the ratio of the maximum power point divided by the open circuit voltage (Voc) and the short circuit current (Jsc). Etching the absorber layer 240 as described above can also increase the porosity of absorber layer 240 over that of an unetched absorber layer (e.g., absorber layer 140, FIG. 1). This can promote $CdCl_2$ doping uniformity and grain growth during the heat treatment of absorber layer 240. Such doping uniformity and grain growth can reduce the occurrence of electrical defects within absorber layer 240 having so-called "dangling bonds" capable of producing midgap energy levels which promote the recombination of electrons from the conduction band with holes from the valence band which can, in turn, reduce Voc.

Figure 1:
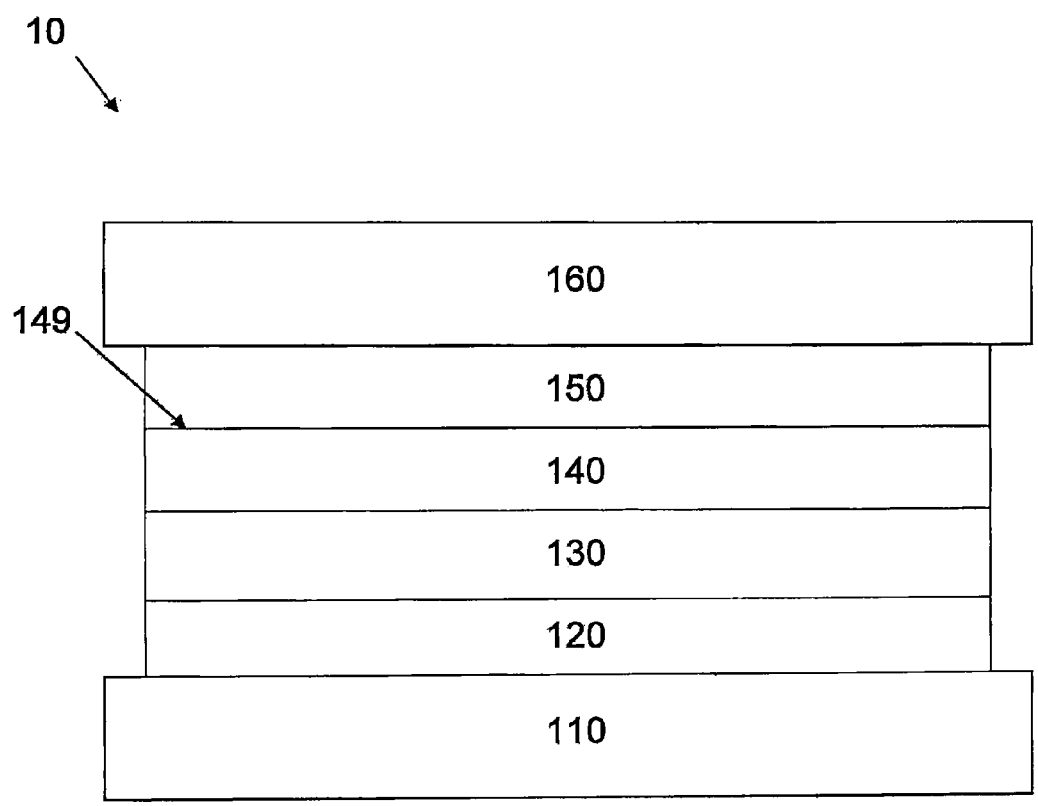
FIG. 1 is a cross-sectional view of a conventional PV device.

Dopants can be applied by any suitable technique. Dopants can be introduced during heat treatment, deployed simultaneously with a CdTe source powder in a vapor transport deposition (VTD) distributor system when forming the CdTe layer 240, or deposited in the form of an outer layer on an absorber layer 240, for example. A dopant may also be introduced as a powder which may be accompanied by an inert carrier gas to facilitate transport of the powder in the VTD system. P-type dopants such as Group I (for example, Li, Na, K, Rb, Cs, Cu, Ag or Au) and Group V (for example, N, P, As, Sb or Bi) elements can be effective absorber layer dopants. Group I and Group V species such as chloride compounds, can be added to the flux solution applied to the back surface 249 of an absorber layer 240 prior to heat treatment, such as $CdCl_2$. Applicants have also observed through visual inspection better doping uniformity with an etched CdTe absorber layer 240 as compared to an unetched CdTe absorber layer 140 (FIG. 1).

Figure 4:
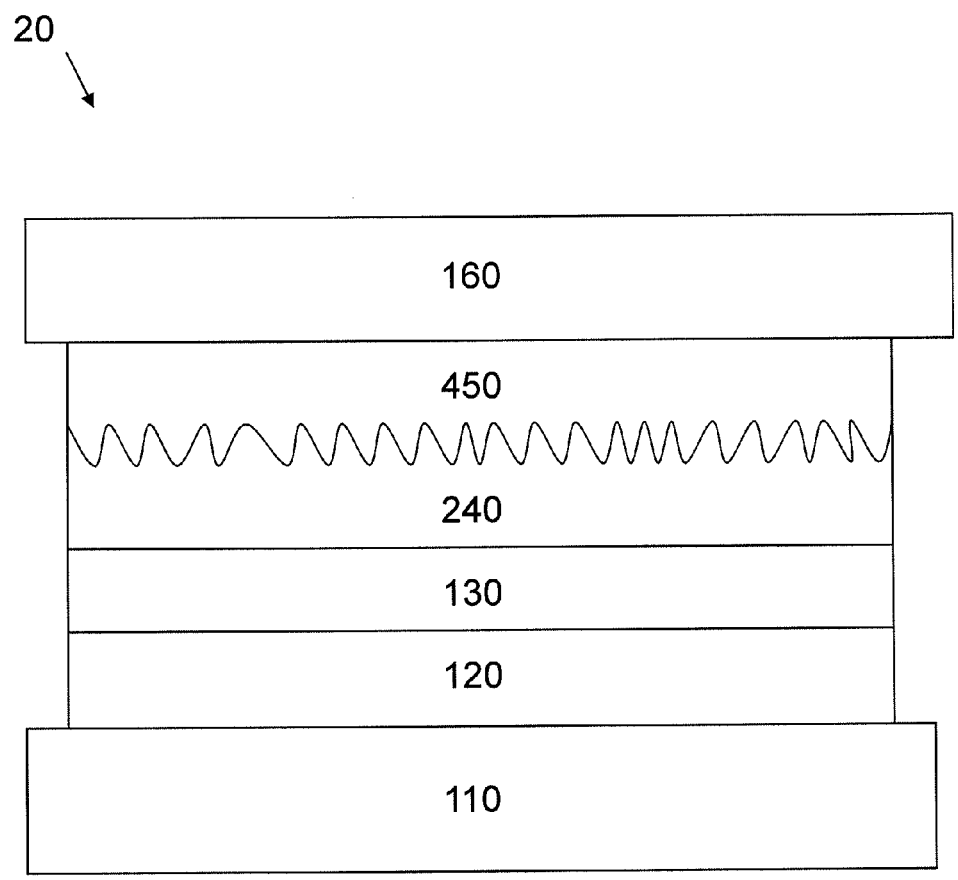
FIG. 4 is a cross-sectional view of the PV device of FIG. 3 at a stage of processing subsequent to that of FIG. 3.

Referring to FIG. 4, after the heat treatment step, a back contact 450 is formed over and in contact with the back surface of the absorber layer 240 and a back support 160, e.g. glass, is formed over back contact 450. FIG. 4 illustrates a cross-sectional view of PV device 20 following formation of back contact 450 and back support 160.

Back contact 450 can be formed by any suitable technique and can include electrically conductive material, such as metallic silver, nickel, copper, aluminum, titanium, palladium, chrome, molybdenum or any practical combination thereof. Back contact 450 may also be a TCO multi-layered stack similar to front contact 120. Back support 160 may be any suitable material formed by a suitable technique. In one embodiment, back support 160 is a soda-lime glass.

Applicants have observed and measured improved adhesion between back contact 450 and etched absorber layer 240 (having a back surface roughness mean value Ra of greater than about 10 nm) as compared to an unetched absorber layer (e.g., layer 140 of FIG. 1 having a back surface roughness mean value Ra of less than about 10 nm) which, as discussed above with respect to FIGS. 2A-2B, improves adhesion of absorber layer 240 to back contact 450 and improves the efficiency of PV device 20.

While disclosed embodiments have been described in detail, it should be readily understood that the invention is not limited to the disclosed embodiments. Rather, the disclosed embodiments can be modified to incorporate any number of variations, alterations, substitutions or equivalent arrangements not heretofore described.

What is claimed as new and desired to be protected by Letters Patent of the United States is:

1. A method of manufacturing a photovoltaic device, the method comprising:
   forming an absorber layer having a back surface;
   etching at least a portion of the back surface of the absorber layer with an etchant comprising HCl and $H_2O_2$ to increase roughness of the back surface of the absorber layer;
   treating the etched absorber layer with a chloride compound, said treating comprising $CdCl_2$ doping the absorber layer and heating the absorber layer; and
   forming a conductive material in contact with the back surface of the absorber layer; and
   wherein said etching increases a roughness mean value from below about 10 nm prior to etching to greater than about 10 nm after etching.

2. The method of claim 1, wherein the step of etching at least a portion of the back surface of the absorber layer comprises one of spraying the etchant on at least the portion of the back surface of the absorber layer, immersing at least the portion of the back surface of the absorber layer in the etchant, and mechanically scrubbing at least the portion of the back surface of the absorber layer with the etchant.

3. The method of claim 1, wherein the etchant comprises about 1% to about 10% HCl, about 0% to about 10% $H_2O_2$ and at least about 80% water, by volume.

4. The method of claim 3, wherein the etchant comprises about 1.5% HCl and about 0.75% $H_2O_2$, by volume.

5. The method of claim 3, wherein the step of etching at least a portion of the back surface of the absorber layer is conducted for a period of about 10 seconds to about 50 seconds.

6. The method of claim 3, further comprising:
   rinsing the etched absorber layer in deionized water; and
   air drying the etched absorber layer.

7. The method of claim 1, further comprising forming a window layer, wherein the absorber layer is formed over the window layer.

8. The method of claim 7, wherein the window layer is selected from the group consisting of ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, and mixtures thereof.

9. The method of claim 1, wherein the chloride compound comprises $CdCl_2$.

10. The method of claim 1, further comprising heating the etched absorber layer in the range of about 380° C. to about 450° C. in association with said chloride compound treatment.

11. The method of claim 1, wherein the absorber layer is selected from the group consisting of: CIGS, CdTe, and amorphous Si.

12. The method of claim 1, further comprising doping the absorber layer with a p-type dopant.

13. The method of claim 12, wherein the p-type dopant is selected from the group consisting of Li, Na, K, Rb, Cs, Cu, Ag, Au, N, P, As, Sb, and Bi.

14. A method of manufacturing a photovoltaic device, the method comprising:
   forming a window layer;
   forming an absorber layer over the window layer, said absorber layer having a back surface;
   etching at least a portion of the back surface of the absorber layer with an etchant comprising HCl and $H_2O_2$ to increase roughness of the back surface of the absorber layer;
   treating the etched absorber layer with a chloride compound, said treating comprising $CdCl_2$ doping the absorber layer and heating the etched absorber layer and
   forming a back contact in contact with the back surface of the absorber layer; and
   wherein said etching increases a roughness mean value from below about 10 nm prior to etching to greater than about 10 nm after etching.

15. The method of claim 14, wherein the back surface of the absorber layer has a first roughness mean value prior to the etching, wherein the etching comprises modifying at least a portion of the back surface of the absorber layer such that the back surface has a second roughness mean value, and wherein the second roughness mean value is greater than the first roughness mean value.

16. The method of claim 14, further comprising:
   rinsing the etched absorber layer in deionized water; and
   air drying the rinsed absorber layer.

17. The method of claim 15, wherein the second roughness mean value is greater than about 10 nm.

18. The method of claim 14, wherein the etchant comprises about 1% to about 10% HCl, about 0% to about 10% $H_2O_2$ and at least about 80% water, by volume.

19. The method of claim 18, wherein the etchant comprises about 1.5% HCl and about 0.75% $H_2O_2$, by volume.

20. The method of claim 14, wherein the absorber layer is selected from the group consisting of CIGS, CdTe, and amorphous Si.

* * * * *